United States Patent [19]

Mushkin

[11] 4,176,730

[45] Dec. 4, 1979

[54] SPEAKER CABINET

[76] Inventor: Nicholas M. Mushkin, 4755 E. Flaming Rd., Las Vegas, Nev. 89109

[21] Appl. No.: 873,140

[22] Filed: Jan. 30, 1978

[51] Int. Cl.[2] .......................... H05K 5/00; G10K 11/00; A47B 81/06

[52] U.S. Cl. .................................... 181/148; 181/156; 181/175; 181/199

[58] Field of Search ............... 181/156, 199, 148, 149, 181/150, 151, 153, 154, 155, 175, 160, 141; 84/276

[56] References Cited

U.S. PATENT DOCUMENTS

| | | | |
|---|---|---|---|
| 1,689,136 | 10/1928 | Hastings | 181/141 |
| 2,036,832 | 4/1936 | Scheldorf | 181/145 |
| 2,071,170 | 2/1937 | Maxwell | 181/156 |
| 3,014,394 | 12/1961 | Szymanski | 84/276 |
| 3,090,461 | 5/1963 | Gray | 181/148 |
| 3,143,182 | 8/1964 | Sears et al. | 181/153 |
| 3,826,333 | 7/1974 | Buckwalter | 181/155 |

*Primary Examiner*—Stephen J. Tomsky
*Attorney, Agent, or Firm*—Seiler & Quirk

[57] ABSTRACT

A speaker cabinet comprises an enclosure having a top, bottom, front, back and two side panels, each panel being contiguous with an adjacent panel along its four edges, and the front panel having a sound port and interiorally of which is mounted a speaker, an improvement comprising a sound post extending and wedged between the front and back panels, an elongated bass bar secured along its length to the front panel, a pair of elongated blocks, each extending between and contacting the front and back panels, one of the blocks being secured to the top panel along its length and the other block secured to the bottom panel along its length, and a support plate secured along the back panel and extending between the side panels.

9 Claims, 4 Drawing Figures

SPEAKER CABINET

BACKGROUND OF THE INVENTION

Cabinets or enclosures for housing speakers, and in which the speakers are mounted, are continually being improved or modified in an attempt to optimize the sound reproduction obtained from the speaker and cabinet assembly. Although a significant number of different, varying, and sometimes conflicting theories are proposed for optimizing speaker cabinet sound characteristics, they all have the common end of attempting to accurately reproduce, as nearly as possible, actual electronically recorded sound, or reproducing output signals from a ratio receiver or otherwise amplified through an electronic sound amplification system.

SUMMARY OF THE INVENTION

The present invention is directed to a speaker cabinet, so constructed as to accurately reproduce sound generated from a speaker mounted in the cabinet enclosure. Incorporating one or more components comprising a sound post, bass bar, end blocks, and a back support plate, the resulting cabinet causes magnification of the sound, and projects it to all areas of a room or auditorium, rather than being merely directional. Because of the aforesaid components, the entire cabinet is involved in the sound reproduction and achieves distortion-free sound, including restoration of overtones in a manner much like sound transmitted by a string instrument, unlike many state of the art speaker enclosures or cabinets. The specific features of the invention will be more completely disclosed hereinafter.

DETAILED DESCRIPTION OF THE INVENTION

Figure 1:
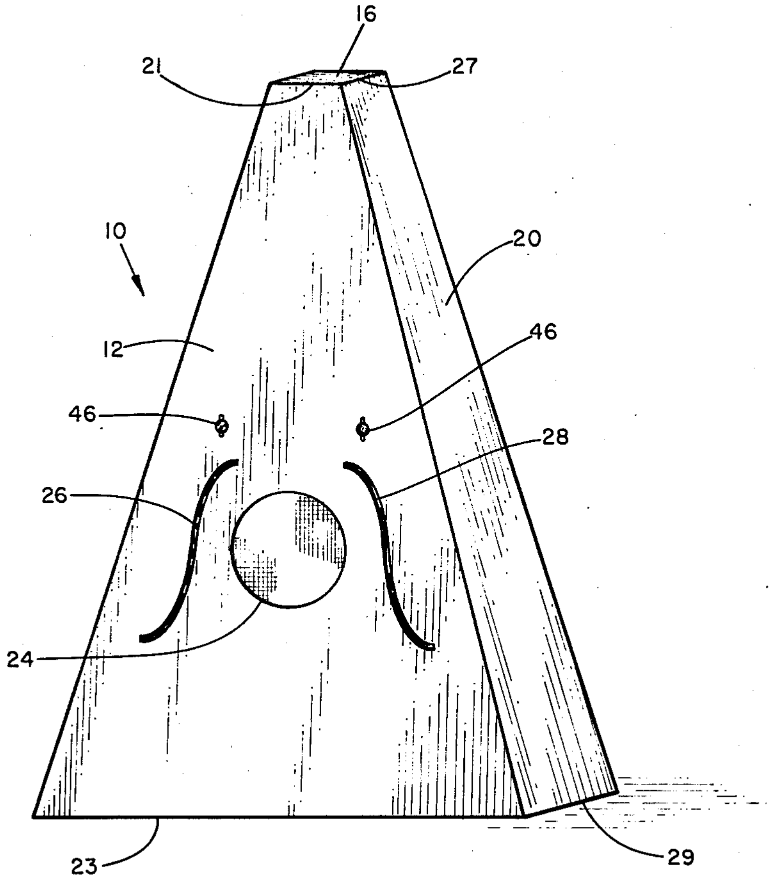
FIG. 1 is a perspective view taken from the front of the cabinet of the invention.

The front exterior of the speaker case or cabinet 10 of the assembly is illustrated in FIG. 1. Shown are front panel 12, a side panel 20, and top panel 16. An opposite side panel is not visible, but it is substantially identical to side panel 20. Further, bottom and back panels are not visible, although the back panel is the same size as front panel 12, but does not incorporate a sound port 24 nor optional sound openings 26 and 28. The front panel sound openings 26 and 28, often referred to as "F" holes or openings may or may not be present, depending on the desired bass or treble sound, as well as additional acoustical characteristics desired. A speaker will be mounted within the cabinet interior to front panel 12 normally with the speaker cone approximately centered with respect to sound port 24. It may be desirable to incorporate a fabric or screen material over the sound port in order to obscure the speaker itself thereby improving the attractiveness of the cabinet as it is viewed.

Figure 2:
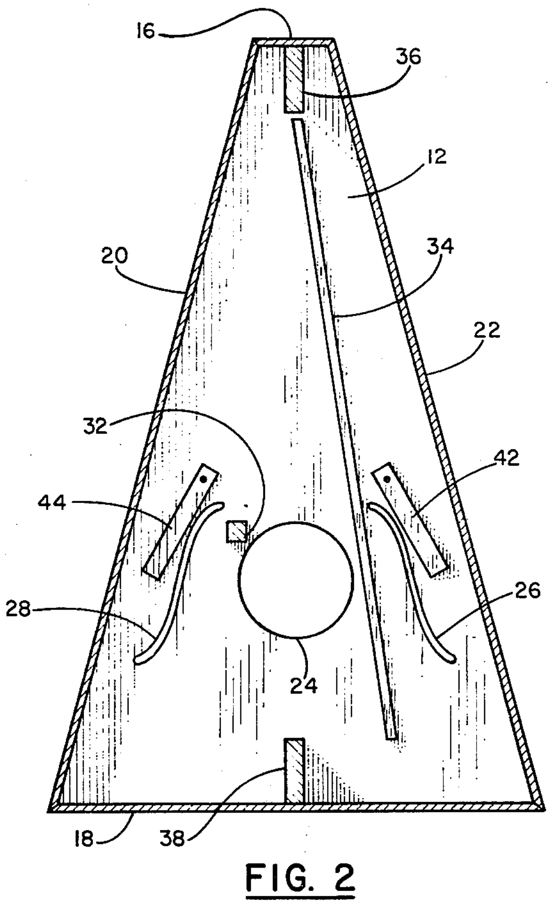
FIG. 2 is a elevational view of the interior of the speaker cabinet with the back plate removed.
Figure 3:
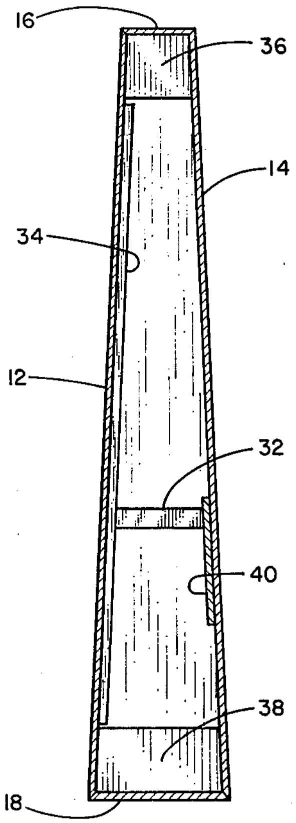
FIG. 3 is a interior cabinet view with one side plate removed.
Figure 4:
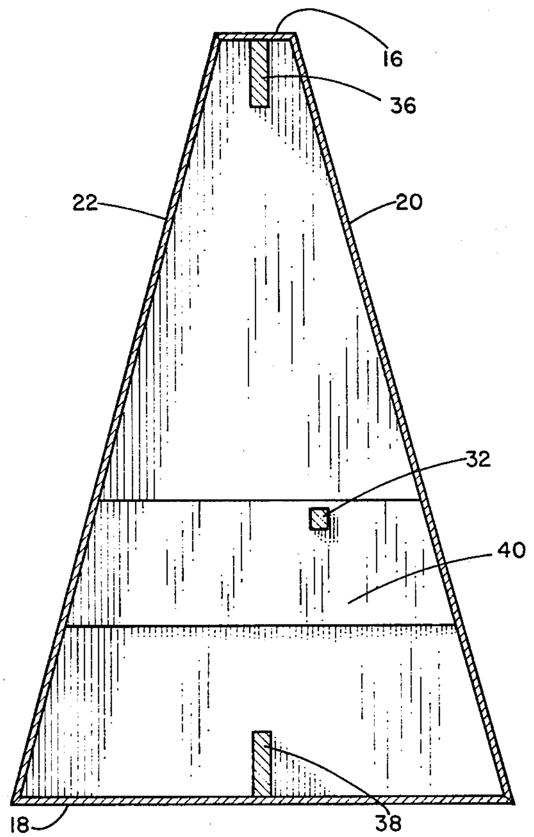
FIG. 4 is an elevational view of the cabinet interior with the front plate removed.

Observing FIG. 2, the speaker cabinet interior is viewed from the back, the back panel having been removed, so that the interior surface of the front panel 12 is observed. FIG. 3 is a side elevational view of the cabinet interior viewed with side panel 20 removed and looking toward the interior surface of side panel 22. FIG. 4 is a view of the cabinet interior toward the back panel, with the front panel removed. The components of the cabinet of the invention will be described with reference to those three figures.

A sound post 32 extends between the front and back panels, and is wedged against both of those panels. The sound post is an elongated bar or rod, preferably composed of wood so that it will suitably transfer sound vibrations from the front to the back panel, the front panel being vibrated extensively in the area adjacent the sound port 24 due to vibration of the speaker cone. The cross-sectional shape of the sound post is not critical and although that shown is square, it may be round, rectangular, or the like. The length of sound post 32 should be sufficient so that it can be evenly and fully wedged or stressed against both the front and back panel interior walls. Because the sound post functions to equalize or normalize the vibrations of the front and back panels, it is preferably secured as near or adjacent sound port 24 as possible or practical since the speaker is also secured around that port. Moreover, sound post 32 is also preferably extended between the front and back panels parallel with bottom panel 18 rather than angularly thereto. The sound post is installed by forcing its ends against the front and back panels whereby it will extend across the cabinet interior space. If an optional back plate 40 is incorporated in the cabinet, the sound post will abut the plate as shown in FIG. 3. A small tack or brad may be secured through the back panel into the end of the sound post to prevent it from becoming displaced when the cabinet is being moved.

Secured along the interior front panel surface is a bass bar 34, which is elongated and extends for a substantial distance along the front panel as shown. The purpose of the bass bar is to assist in producing vibrations in the lower register along a substantial portion of the front panel. Thus, as vibrations are created within the enclosed cabinet chamber, as well as near the front panel sound port 24 by the speaker mounted at the port, these vibrations are more evenly distributed along the entire front panel by base bar 34, thereby giving a much more even resonating sound reproduction to the cabinet. Accordingly, bass bar 34 extends so that its upper end is near or adjacent top panel 16, while its lower end is near or adjacent bottom panel 18 as illustrated in FIGS. 2 and 3. Preferably, the bass bar will extend along at least two-thirds of the height of the front panel, and more preferably three-quarters or more of that distance. Moreover, the bass bar is independent of side panels 20 and 22 as shown in FIG. 2, so that it is not mounted against one or the other of the side panels. Further, because of the central location of sound port 24, it may be desirable to angle the base bar somewhat as illustrated, so that it will extend the desired distrance along the front panel, while at the same time pass adjacent sound port 24, but without interferring with sound post 32. Thus, it may be most convenient to mount the bass bar on the opposite side of sound port 24 from sound post 32 as illustrated in FIG. 2. Because of the extensive sound vibration caused by the speaker edge mounted at or near the edge of sound port 24, it is desirable that the bass bar pass as near to that port as is practical. As further viewed in FIG. 3, the bass bar is secured along substantially its entire length to the interior surface of front panel 12, again it being understood that the purpose of the bar is to equalize transmission of sound along a substantial portion of the front panel. Again, wood is the preferred composition of the bass bar for such sound transmission. The cross-sectional shape of the bass bar is optional, although a rectangular or square shape is preferred, since it provides a flat side for mounting flush and evenly with and along the front panel planar surface.

Another component of the improved speaker cabinet of the invention is the incorporation of a pair of block members 36 and 38, one of which is secured to the top panel, and the other to the bottom panel. As illustrated in FIGS. 2–4, upper block member 36 extends between and is secured against both the front and back panels at the block member ends, while the length of the member 36 is secured to top panel 16. The opposite block member 38 is also secured to the front and back panels at its ends, and lies along its length against bottom panel 18. Accordingly, both of these block members are secured against three panels, and assist in structural rigidity as well as further assisting in enhancing acoustical characteristics by transmitting vibrations between the front and back panels as well as along the top and bottom panels. Again, the material used for the block members is preferably wood, and cross-sectional shape is not necessarily critical, so long as a flat surface rests against the respective top or bottom panel, and with the flat ends against the respective front and back panels. The end blocks are each preferably about 4 to 5 inches high, or between about 5 to 15% of the height of the speaker cabinet.

FIGS. 3 and 4 illustrate a further improvement comprising a back brace or support plate secured along a portion of the interior planar back plate surface. A preferred plate is ½ to ¾ inch thick and 4 to 6 inches high. Such a support plate 40 is preferably flat on both sides as illustrated, and extends along and is secured to a portion of the interior back panel surface between the side panels, preferably directly behind the sound port. The plate provides further rigidity to the back panel of the speaker, in the area to which the sound post 32 is secured. The sound post is actually wedged against the plate 40 at the flat sound post end surface. Again, the material of the back plate is preferably wood because of its fine acoustical transmission characteristics.

A further optional feature incorporates means for varying the size of the "F" or sound openings 26 and 28. By enlarging or restricting these openings, different sound and balance qualities can be achieved to meet different needs, depending on room size or accoustics, etc. For this purpose, cover shutters 42 and 44 may be installed on the cabinet, preferably on the interior as shown in FIG. 2. The size or length of such shutters depends on the maximum restriction of the sound openings desired, with those shown being about ½ of the opening length. Each shutter may be secured to a knob 46, exposed on the cabinet exterior, and by manually turning a knob, the shutter may be moved across the sound opening to the desired extent. The sound openings may be of a scroll shape as is common to string instruments, or any other suitable or desirable shape. As is clearly illustrated in the drawings, the top panel 16 is smaller than the bottom panel 18, with the side panels 20 and 22 extending angularly to the side edges of those respective top and bottom panels. The smaller the top panel, the more audibly will high or upper register sounds be transmitted. Accordingly, a preferred cabinet incorporates a pyramid type shape in which both the width and length of the top panel are less than the corresponding bottom panel dimensions. Preferably, the ratio of the length of the top panel along edge 21 and bottom panel edge 23 is between about 1:2 and 1:8, although for some sound characteristics, it may be desirable to utilize top and bottom panels having length ratios outside of this range to achieve the special sound characteristics. However, for most practical applications, the aforesaid top:bottom panel length ratios will be preferred; more preferably the ratio is between about 1:4 and about 1:6, ideally 1:5. As for the ratio of the top:bottom panel widths, along edges 27 and 29, respectively, preferred figures are between about 1:1 and 1:2, respectively, ideally about 1:1.8. The material used for producing the panels of the cabinet are preferably the woods, with panels normally having a thickness of between about 1/16" and ⅜". Although by way of illustration only, a speaker cabinet, according to the invention, having a top panel dimension of 5"×5", a bottom panel dimension of 24"×9", and an overall height of 47", has been found to achieve fine sound characteristics. Other modifications within the purview of the invention as well as the advantages of such a device will be evident to those skilled in the art.

I claim:

1. A speaker cabinet having a speaker mounted therein comprising an enclosure having top and bottom, two side and front and back panels, each side panel being contiguous with the top, bottom, front and back panels, a sound post wedged and extending between said front and back panels, said front panel having a sound port for said speaker, and an elongated bar extending towards said top and bottom panels and at least two-thirds of the distance between and secured substantially along its entire length to said front panel and without contact with any other panel.

2. The speaker cabinet of claim 1 wherein said front and back panels have a top:bottom length ratio of between about 1:2 and 1:8.

3. The speaker cabinet of claim 1 wherein said top and bottom panels are each contiguous with said front, back and side panels and having a pair of elongated block members each extending between and contacting said front and back panels, a first block member being secured to said top panel along its length and a second block member secured to said bottom panel along its length.

4. The speaker cabinet of claim 3 wherein said block members are intermediate and independent of said side panels.

5. The speaker cabinet of claim 3 wherein said front and back panels have a top:bottom length ratio of between about 1:4 and 1:6 and are tapered evenly between said top and bottom.

6. The speaker cabinet of claim 1 including a plate secured along said back panel and extending between said side panels.

7. The speaker cabinet of claim 3 including a plate secured along said back panel and extending between said side panels.

8. The speaker of claim 1 having one or more sound openings in the front panel, and means on said front panel for variably restricting the size of the openings.

9. The speaker of claims 1, 2 or 5 wherein said elongated bar extends lengthwise along at least three-fourths of the distance of said front panel between said top and bottom panels.

* * * * *